United States Patent
Huang

(10) Patent No.: US 6,644,979 B2
(45) Date of Patent: Nov. 11, 2003

(54) BACKPLANE STRUCTURE CAPABLE OF BEING MOUNTED WITH TWO INTERFACE CARDS

(76) Inventor: Kuo-Chen Huang, 3 Fl., No. 11, Lane 200, Sec. 2, Duenhua S. Rd., Taipei (TW)

( * ) Notice: Subject to any disclaimer, the term of this patent is extended or adjusted under 35 U.S.C. 154(b) by 0 days.

(21) Appl. No.: 09/895,358

(22) Filed: Jun. 29, 2001

(65) Prior Publication Data

US 2003/0003778 A1 Jan. 2, 2003

(51) Int. Cl.[7] .............................................. H01R 12/00
(52) U.S. Cl. ........................................ 439/65; 439/60
(58) Field of Search .............................. 439/65, 59, 60; 361/686, 788, 796; 710/100, 129; 385/53, 88

(56) References Cited

U.S. PATENT DOCUMENTS 5,852,725 A * 12/1998 Yen ............................ 395/282
6,147,863 A * 11/2000 Moore et al. ............... 361/686

* cited by examiner

Primary Examiner—Alexander Gilman
(74) Attorney, Agent, or Firm—Trojan Law Offices

(57) ABSTRACT

A backplane structure is capable of being mounted with two interface cards for being used in an industrial computer. The backplane structure includes a backplane capable of being connected to a mother board of the industrial computer and having a first side, a second side and a height of 1U (1.75"). A first peripheral component interconnection (PCI) port is provided on an upper portion of said first side, an industry standard architecture (ISA) port having a plurality of terminals on two ends thereof is provided on the lower portion of the second side by soldering so as to form a terminal-less region on the first side. In addition, a second peripheral component interconnection (PCI) port is provided on the terminal-less region on the first side.

2 Claims, 7 Drawing Sheets

BACKPLANE STRUCTURE CAPABLE OF BEING MOUNTED WITH TWO INTERFACE CARDS

FIELD OF THE INVENTION

The present invention relates to a backplane structure, and more particularly to a backplane structure capable of being mounted with two interface cards for being used in an industrial computer.

BACKGROUND OF THE INVENTION

Please refer to FIGS. 1 and 2. Generally, the conventional mother board for being used in an industrial computer has a standard specification for its size, a mother board A and a backplane B are included therein. The mother board A has a plurality of contact pads A1, A2 A3 and A4 on the edges thereof. The passive backplane B is capable of being connected to the mother board A and has a front side (not shown), a back side (not shown) and a standardized height of 1U (1.75"). A first peripheral component interconnection (PCI) port B1 and a first industry standard architecture (ISA) port B2 are provided on a lower portion of the front side, respectively. A second industry standard architecture (ISA) port B3 is provided on an upper portion of the back side and a second peripheral component interconnection (PCI) port B4 is provided on a central portion thereof. Meanwhile, the first PCI port B1 is connected to the contact pads A1 and A2 of the mother board A and the first ISA port B2 is connected to the contact pads A3 and A4 of the mother board A when the backplane B is connected to the mother board A. Moreover, a standardized interface card C can be connected to either the second ISA port B3 or the second PCI port B4 on the second side of the backplane B.

However, some interface cards are developed owing to the great progress in the technology of network and communication. The interface card C could be a voice card, a network card, a video display card, a video card, a sound card and so on. The interval between the second ISA port B3 and the second PCI port B4 is very narrow under the limit of the standardized height of 1U (1.75") in the backplane B; therefore two interface cards fail to be mounted on the second ISA port B3 and the second PCI port B4, respectively. Only a single interface card can be selectively mounted on the second ISA port B3 or the second PCI port B4.

SUMMARY OF THE INVENTION

It is therefore an object of the present invention to provide a backplane structure capable of being mounted with two interface cards thereon simultaneously under the standardized height of a backplane structure.

It is another object of the present invention to provide a backplane structure capable of being mounted with peripheral component interconnection (PCI) cards thereon, simultaneously.

Preferably, the first PCI port and the second PCI port of the backplane are separated apart with an interval ranged from 0.8 to 1.5 cm and capable of being mounted with two interface cards thereon, simultaneously.

The present invention may best be understood through the following descriptions with reference to the accompanying drawings, in which:

DETAILED DESCRIPTION OF THE PREFERRED EMBODIMENT

Figure 1:
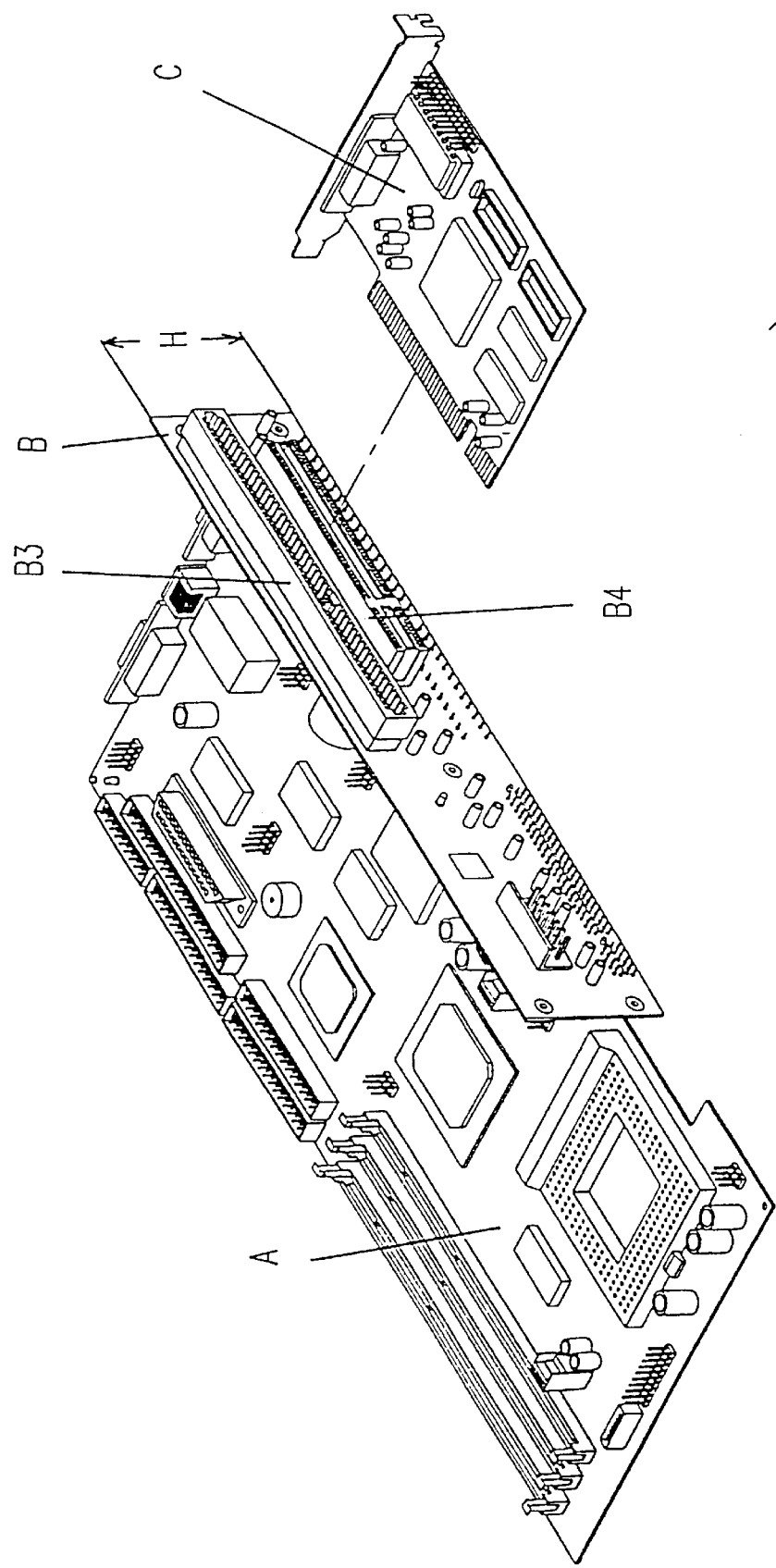
FIG. 1 depicts a conventional industrial computer, in which an interface card is to be connected to a backplane.
Figure 2:
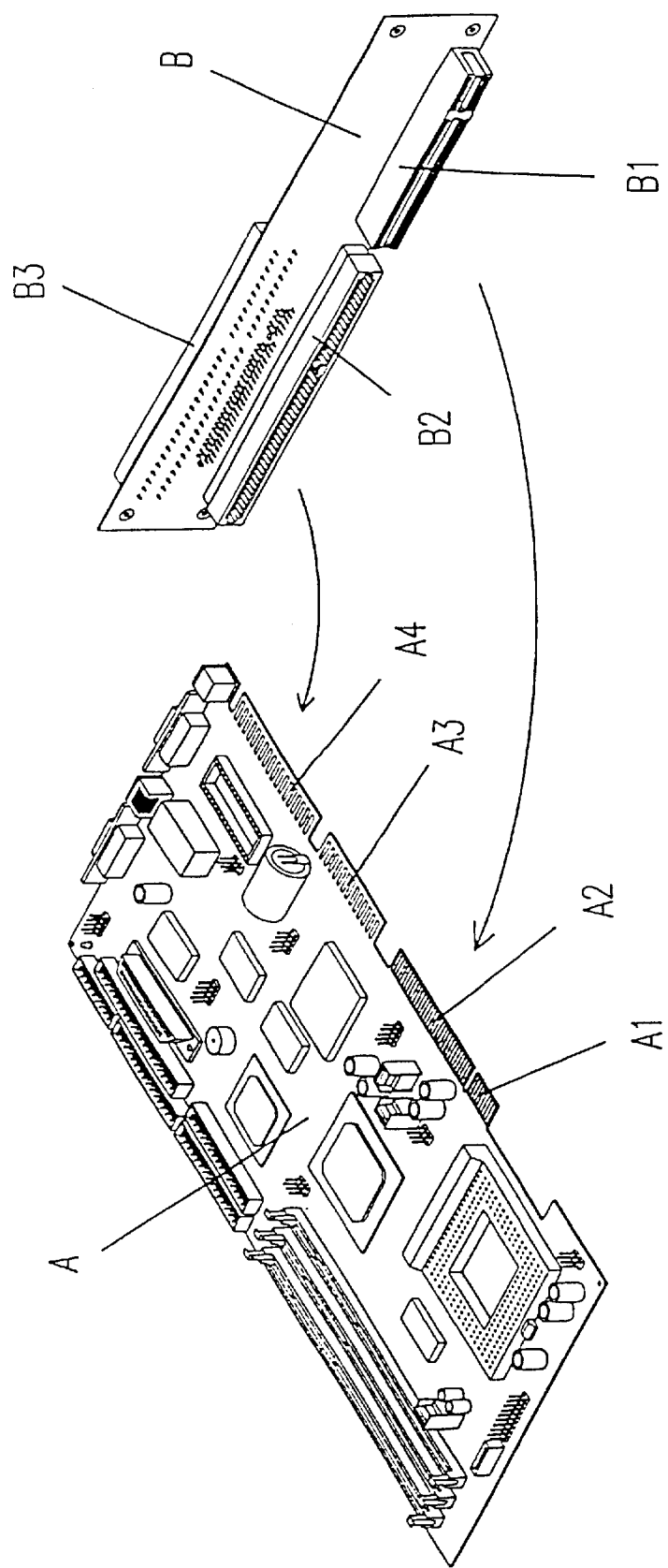
FIG. 2 depicts the connection of a backplane and a mother board in FIG. 1.
Figure 3:
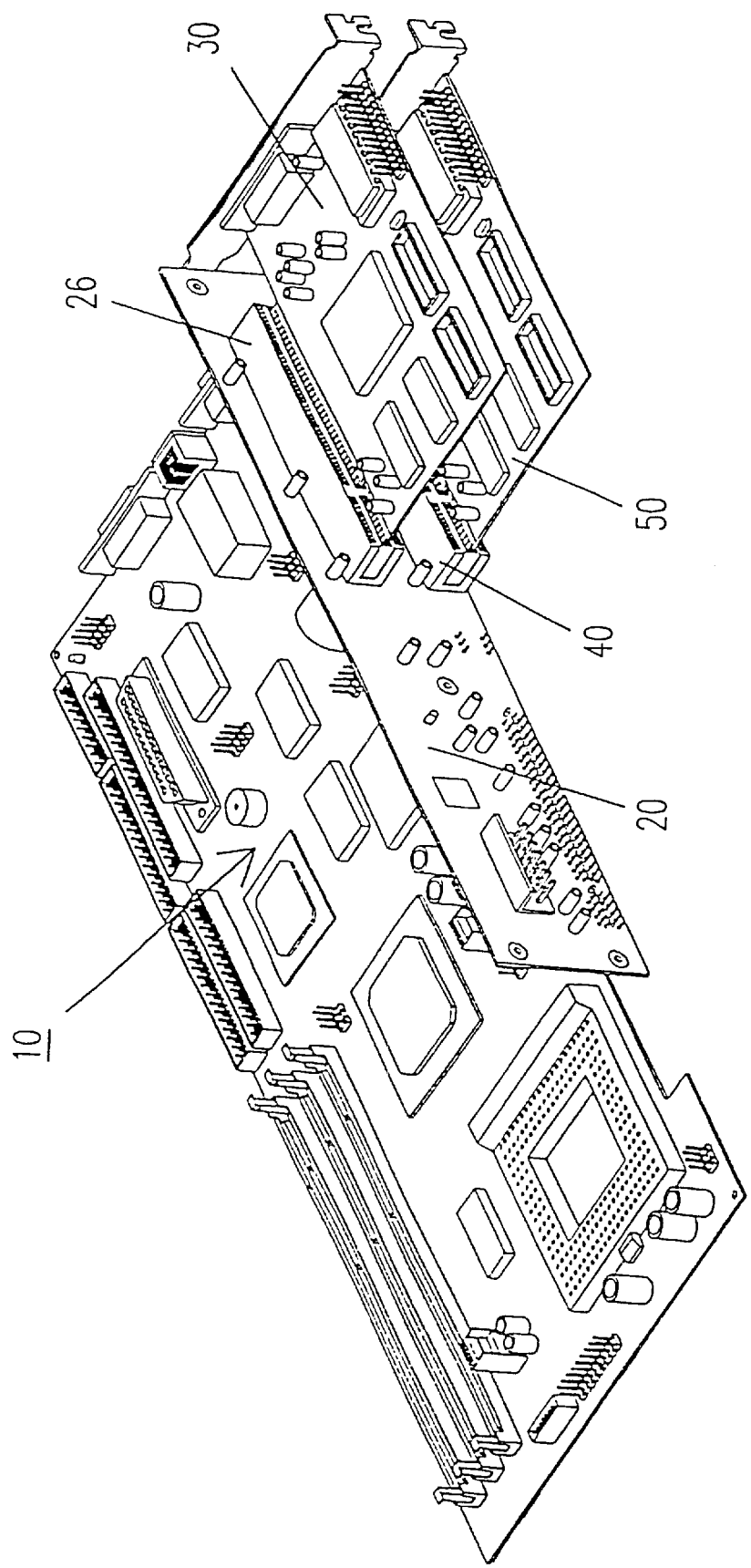
FIG. 3 is a perspective diagram showing a backplane structure capable of being mounted with two interface cards thereon according to a embodiment of the present invention.
Figure 4:
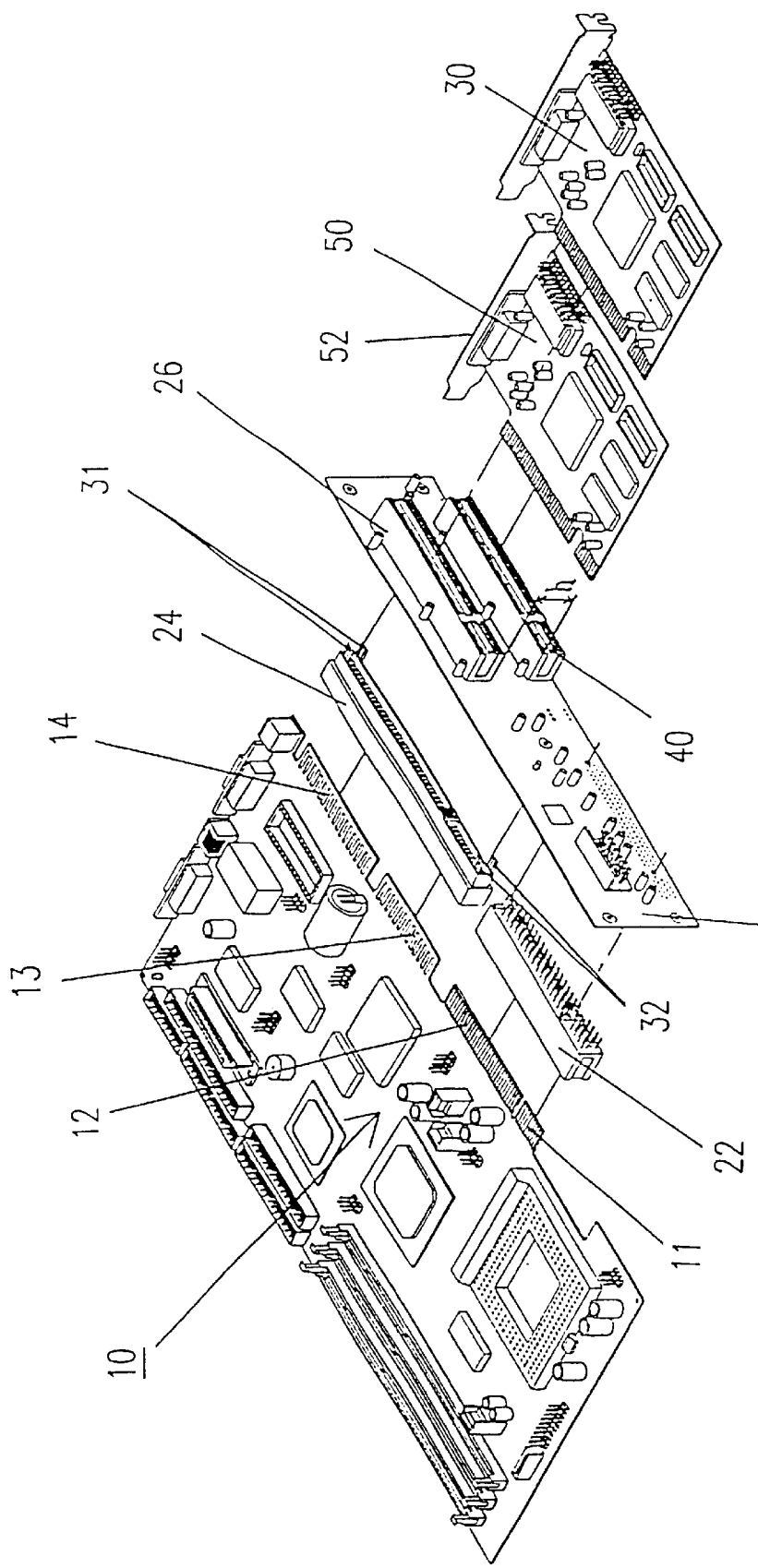
FIG. 4 is a exploded view of FIG. 3.
Figure 5:
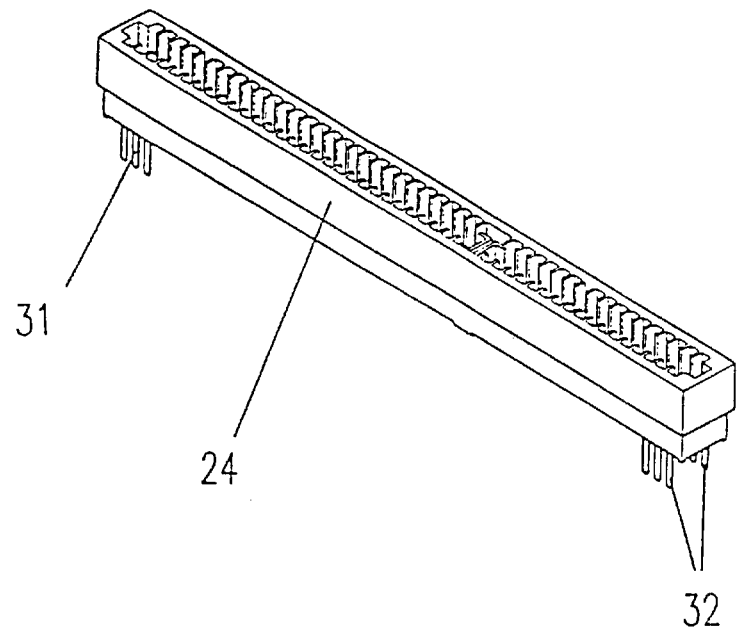
FIG. 5 is a view showing an industry standard architecture (ISA) port according to the present invention.
Figure 6:
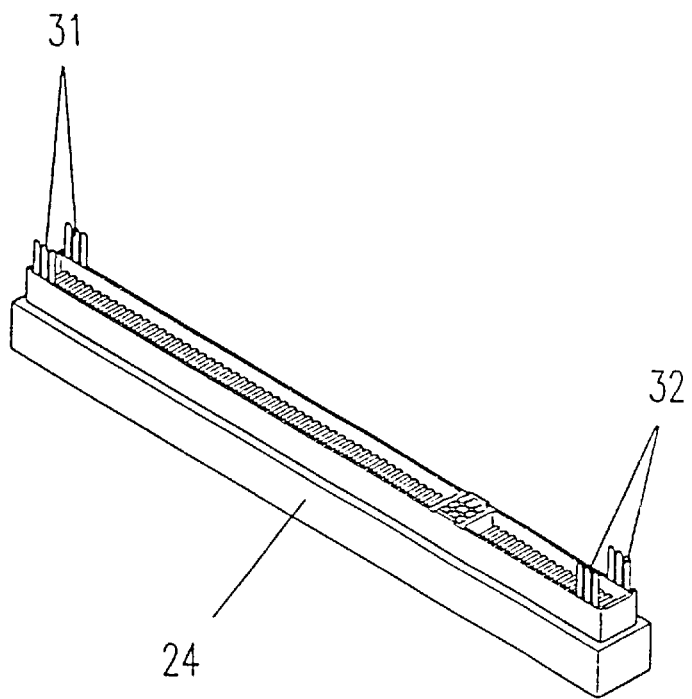
FIG. 6 is a view showing the industry standard architecture (ISA) port in FIG. 5, wherein the ISA port is upside-down.

Please refer to FIGS. 3 to 5. A mother board 10 for being used in an industrial computer (not shown) includes pins-contact pads 11, 12, 13 and 14. A first peripheral component interconnection (PCI) port 26 is provided on an upper portion of a back side of a backplane 20. The backplane 20 is capable of being connected to the pins-contact pads 11, 12, 13 and 14 of the mother board 10 and has a height of 1U (1.75").

Figure 7:
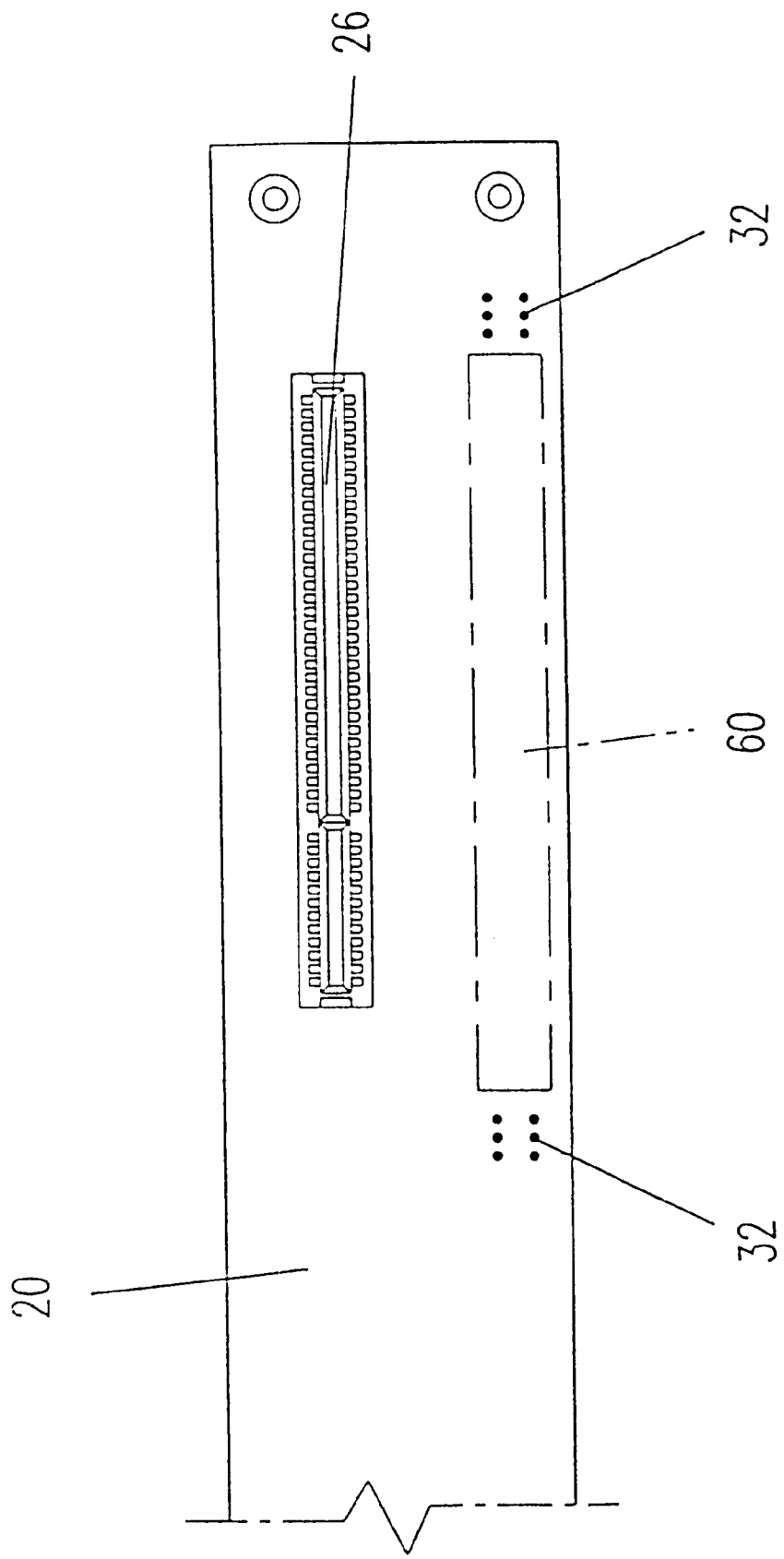
FIG. 7 is a schematic view showing an outside plane of the backplane structure according to the present invention.
Figure 8:
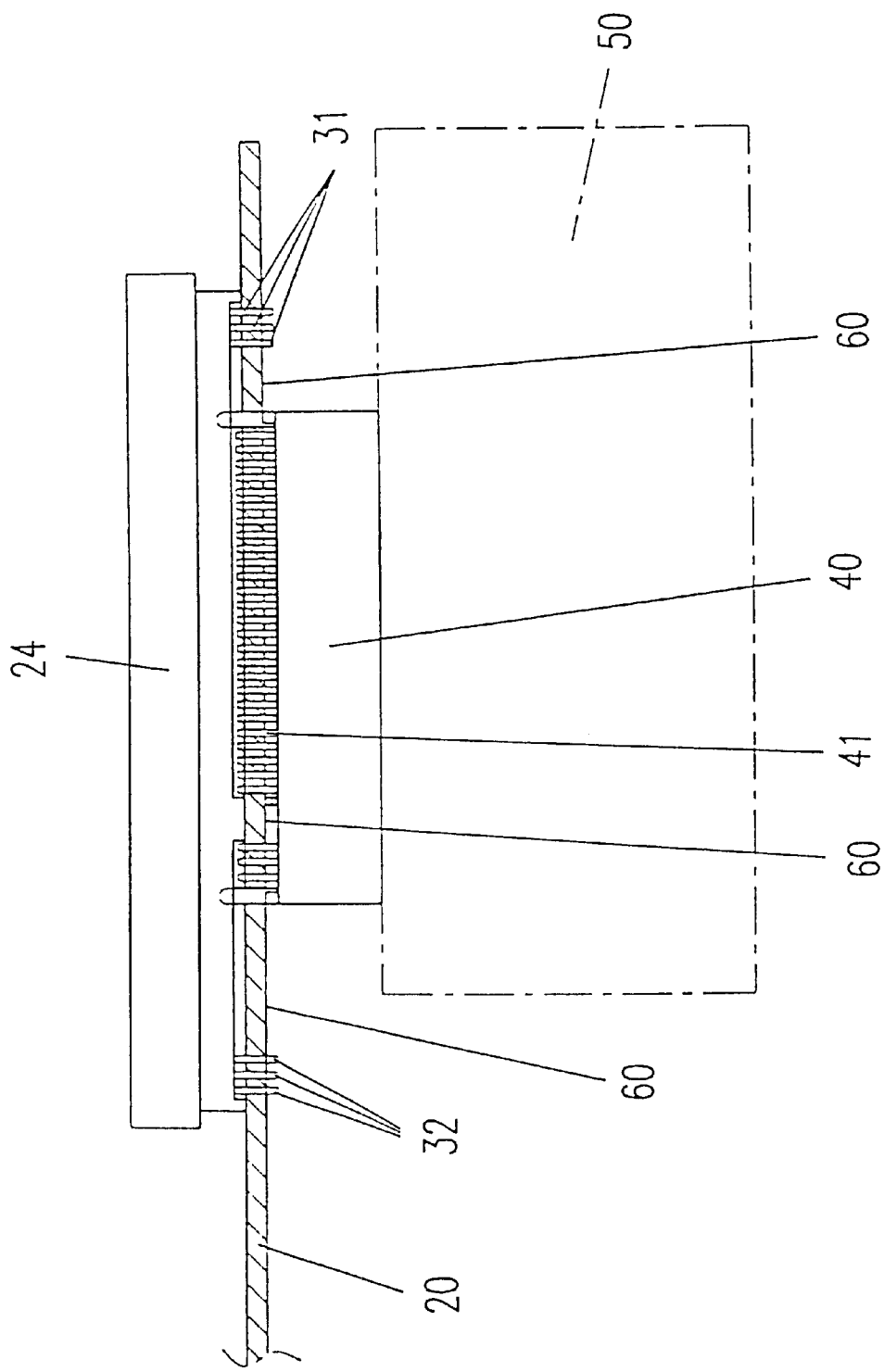
FIG. 8 is a sectional view showing a peripheral component interconnection (PCI) port mounted on the backplane structure according to the present invention.

Referring to FIGS. 4 and 5, an industry standard architecture (ISA) port 24 has terminals 32 and 33 on two ends thereof to be mounted and soldered on a front side of the backplane 20 and connected to a printed circuit board (PCB) (not shown) for providing a power to the mother board 10 via the terminals 32 and 33. The industry standard architecture (ISA) port 24 includes a plurality of corresponding holes (not shown) for being inserted by a plurality of terminals (not shown) and only the holes of two ends thereof are inserted by terminals 32 and 33. Therefore, the industry standard architecture (ISA) port 24 is provided on the backplane 20 to form a terminal-less region 60 on the back side of the backplane 20, as shown in FIG. 7. Moreover, the terminal-less region 60 is capable of being provided with a second peripheral component interconnection (PCI) port 40 by soldering terminals 41 thereof, as shown in FIG. 8. In FIGS. 3 and 4, the corresponding holes of the industry standard architecture (ISA) port 24 can be connected to the pins-contact pads 13 and 14 so as to fix the connection between the mother board 10 and the backplane 20.

Please refer to FIG. 7. The industry standard architecture (ISA) port 24 is provided on a lower portion of the back side of the backplane 20 and includes a central terminal-less section thereof to from the terminal-less region 60. The terminal-less region 60 has a height of 1 to 1.2 cm and a length of 11 cm. In addition, the peripheral component interconnection (PCI) port has a standardized size, e.g. 0.9 cm×8.4 mm. Consequently, the terminals 41 of the second peripheral component interconnection (PCI) port 40 is capable of being soldered on the terminal-less region 60 for being electrically connected to other circuits (not shown).

A first interface card 30 and a second interface card 50 are capable of being mounted on the first peripheral component interconnection (PCI) port 26 and the second peripheral component interconnection (PCI) port 40, respectively and simultaneously. Furthermore, some standardized electrical components (not shown) are soldered on a surface portion of the second interface card 50 and the average thickness thereof is merely 1 cm. The first peripheral component interconnection (PCI) port 26 and the second peripheral component interconnection (PCI) port 40 are separated apart with an interval ranging from 0.8 to 1.5 cm. Therefore, the first interface card 30 and the second interface card 50 will not interfere each other. Moreover, a horizontal metal piece 52 provided on an edge of the second interface card 50 will not touch the edge of the backplane 20. Thus, the connection of the mother board 10 and the backplane would be not obstructed by the horizontal metal piece 52 of the second interface card 50. The first interface card 30 and the second interface card 50 are capable of being simultaneously mounted on the backplane 20 at the limited height of 1U (1.75") for overcoming the disadvantages of the prior art.

In this illustrative embodiment, the present invention provides a backplane structure a standardized height of 1U (1.75"), capable of being mounted with two interface cards thereon. The system efficiency and expansibility in the industrial computer could be enhanced.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What I claim is:

1. A backplane structure for mounting two interface cards thereon used in an industrial computer, comprising:

a backplane capable of being connected to a mother board of the industrial computer and having a height of 1U (1.75");

a first peripheral component interconnection (PCI) port provided on an upper portion of a first side of said backplane;

an industry standard architecture (ISA) port having plural terminals on two ends thereof, and elimination of part of said terminals on a central part of said ISA port provided on a lower portion of a second side of said backplane by soldering so as to form a terminal-less region on said first side; and a second peripheral component interconnection (PCI) port provided on said terminal-less region on said first side, and side-by-side separated away from said first PCI port with a special interval defined large enough to simultaneously accommodate two interface cards in said PCI ports without interference under limitation of said 1.75" backplane.

2. The backplane structure according to claim 1, wherein said interval is ranged from 0.8 to 1.5 cm and mounted with two interface cards in said PCI ports, simultaneously.

* * * * *